(12) United States Patent
Ahn et al.

(10) Patent No.: US 9,362,322 B2
(45) Date of Patent: Jun. 7, 2016

(54) LIGHT-SENSING APPARATUS, METHOD OF DRIVING THE LIGHT-SENSING APPARATUS, AND OPTICAL TOUCH SCREEN APPARATUS INCLUDING THE LIGHT-SENSING APPARATUS

(75) Inventors: Seung-eon Ahn, Hwaseong-si (KR); I-hun Song, Hwaseong-si (KR); Sang-hun Jeon, Seoul (KR); Young Kim, Yongin-si (KR); Yong-woo Jeon, Seoul (KR); Chang-jung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 824 days.

(21) Appl. No.: 13/553,245

(22) Filed: Jul. 19, 2012

(65) Prior Publication Data
US 2013/0063400 A1   Mar. 14, 2013

(30) Foreign Application Priority Data
Sep. 9, 2011   (KR) .......................... 10-2011-0092231

(51) Int. Cl.
*H01L 27/146* (2006.01)
*G06F 3/041* (2006.01)
*G06F 3/042* (2006.01)

(52) U.S. Cl.
CPC ........ *H01L 27/14609* (2013.01); *G06F 3/0412* (2013.01); *G06F 3/0421* (2013.01); *G06F 2203/04103* (2013.01)

(58) Field of Classification Search
CPC ................ G06F 2203/04103; G06F 3/0412; G06F 3/0421; H01L 27/14609
See application file for complete search history.

(56) References Cited

U.S. PATENT DOCUMENTS 6,489,631 B2 * 12/2002 Young ................... G09G 3/3233
                                                          257/291
7,430,025 B2   9/2008 Okamoto et al.
(Continued)

FOREIGN PATENT DOCUMENTS

KR     20060056634 A    5/2006
KR     10-0983524 B1    9/2010
(Continued)

OTHER PUBLICATIONS

Extended Search Report dated Jan. 21, 2015 for European Application No. EP 12178213.0-1959 / 2568502.
(Continued)

*Primary Examiner* — Quan-Zhen Wang
*Assistant Examiner* — Chun-Nan Lin
(74) *Attorney, Agent, or Firm* — Harness, Dickey & Pierce, P.L.C.

(57) ABSTRACT

In one embodiment, a light-sensing apparatus includes a light-sensing pixel array that has a plurality of light-sensing pixels arranged in rows and columns; and a gate driver configured to provide the light-sensing pixels with a gate voltage and a reset signal that have inverted phases. Each of the light-sensing pixels includes a light sensor transistor configured to sense light and a switch transistor configured to output a light-sensing signal from the light-sensor transistor. The gate driver includes a plurality of gate lines connected to gates of the switch transistors, a plurality of reset lines connected to gates of the light sensor transistors, and a plurality of phase inverters each connected between a corresponding reset line and a gate line. Thus, when a gate voltage is applied to one of the plurality of gate lines, a reset signal with an inversed phase to the gate voltage may be applied to a corresponding reset line.

25 Claims, 6 Drawing Sheets

(56) References Cited

U.S. PATENT DOCUMENTS

| | | |
|---|---|---|
| 7,940,252 B2 | 5/2011 | Chuang et al. |
| 2002/0011972 A1* | 1/2002 | Yamazaki et al. ............ 345/74.1 |
| 2002/0063518 A1* | 5/2002 | Okamoto ............ G02F 1/13338 313/506 |
| 2006/0071911 A1* | 4/2006 | Sullivan ........................ 345/173 |
| 2007/0046650 A1 | 3/2007 | Lee et al. |
| 2008/0074401 A1* | 3/2008 | Chung et al. .................. 345/175 |
| 2009/0101900 A1* | 4/2009 | Chuang et al. ................... 257/59 |
| 2009/0200088 A1* | 8/2009 | Chuang ....................... 178/18.01 |
| 2011/0042650 A1 | 2/2011 | Avouris et al. |
| 2011/0073749 A1 | 3/2011 | Liu et al. |
| 2011/0109585 A1 | 5/2011 | Kwon et al. |
| 2011/0284722 A1 | 11/2011 | Ahn et al. |
| 2013/0205662 A1* | 8/2013 | Yancey ................ A01G 27/003 47/66.6 |

FOREIGN PATENT DOCUMENTS

| | | |
|---|---|---|
| KR | 2011-0026661 A | 3/2011 |
| KR | 2011-0043905 A | 4/2011 |
| KR | 1020110128049 | 11/2011 |
| WO | WO-2004038806 A1 | 5/2004 |

OTHER PUBLICATIONS

Office Action issued on Jan. 13. 2016 by the European Patent Office for Application No. 12178213.0.

* cited by examiner

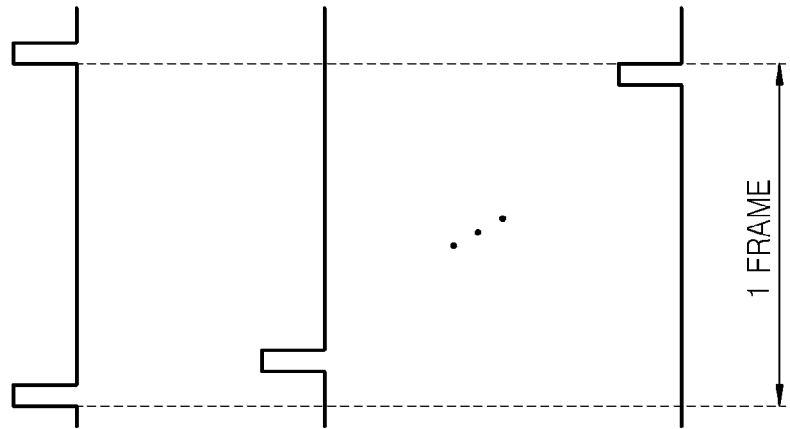
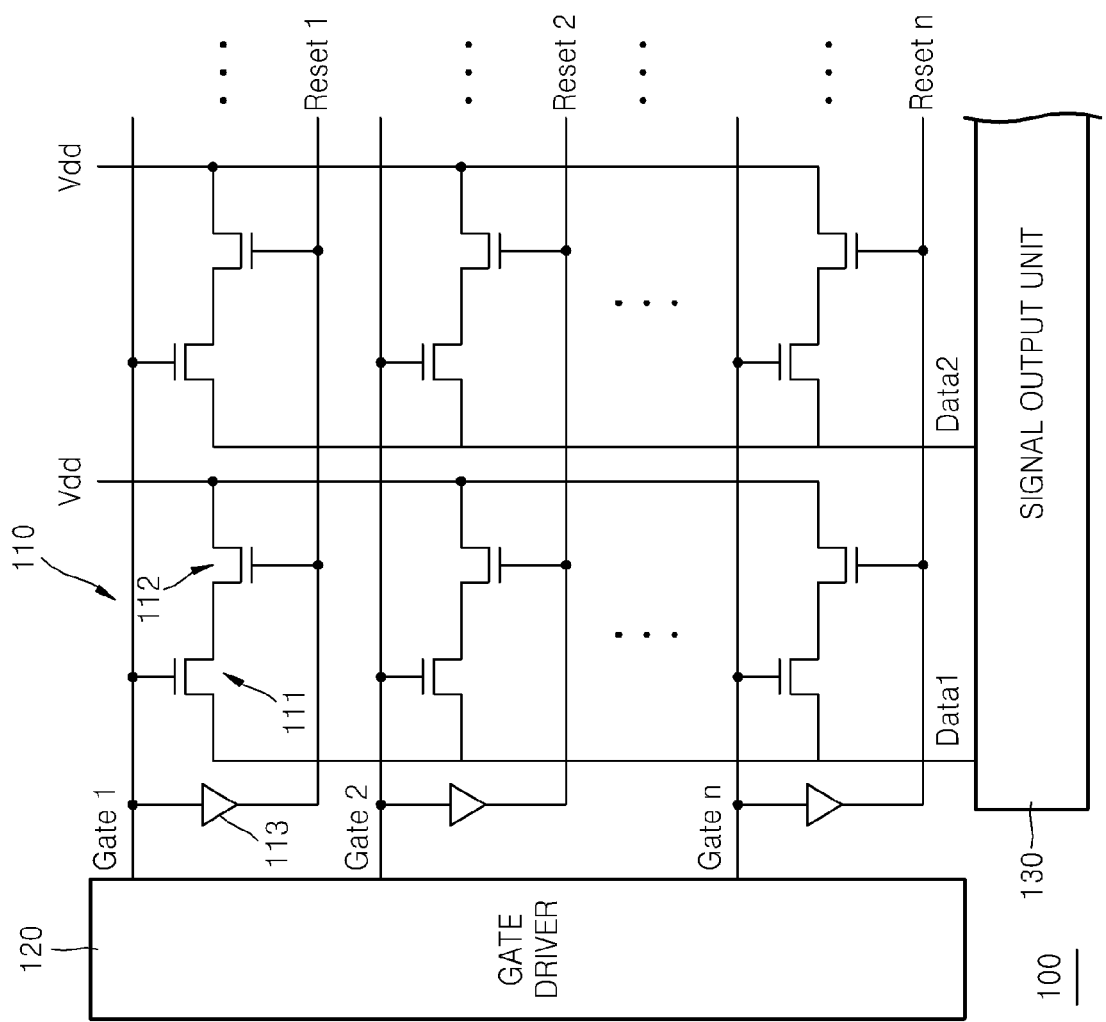

LIGHT-SENSING APPARATUS, METHOD OF DRIVING THE LIGHT-SENSING APPARATUS, AND OPTICAL TOUCH SCREEN APPARATUS INCLUDING THE LIGHT-SENSING APPARATUS

CROSS-REFERENCE TO RELATED APPLICATIONS

This application claims priority to Korean Patent Application No. 10-2011-0092231, filed on Sep. 9, 2011, in the Korean Intellectual Property Office, and all the benefits accruing therefrom under 35 U.S.C. §119, the contents of which in their entirety are herein incorporated by reference.

BACKGROUND

1. Field

One or more example embodiments relate to a light-sensing apparatus, a method of driving the light-sensing apparatus, and/or an optical touch screen apparatus including the light-sensing apparatus.

2. Description of the Related Art

Touch screen devices are devices which directly receive input data through a screen by recognizing a position of, for example, a finger, a stylus, or the like, touching the screen and performing a particular process with software. To this end, a touch screen device is equipped with a touch panel to perform such a function. Touch panels included in the touch screen devices may include resistive overlay type touch panels, capacitive overlay type touch panels, surface acoustic wave (SAW) type touch panels, infrared beam type touch panels, piezoelectric type touch panels, or the like. The touch screen device is widely used in a variety of fields as an input device for replacing a keyboard or a mouse.

A touch screen device that has been widely used employs a method of directly touching a screen of a display device with a finger or a stylus. However, as the size of a display device increases, the distance between the display device and a user increases. In this case, use of the direct touch method may be difficult to adopt. Accordingly, optical touch screen devices that may perform the same function as the existing touch screens by sensing light instead of sensing contact of a finger or a stylus have been proposed. An optical touch screen device is expected to facilitate communication not only between a user and a terminal but also between users.

In order to realize an optical touch panel, a relatively small-sized light-sensing device for sensing light is required. An amorphous silicon thin film transistor (a-Si TFT) is one of generally used light-sensing devices. However, an a-Si TFT does not exhibit a sufficient current change according to light. Accordingly, when light is incident, electric charges generated in a photodiode are accumulated in a capacitor for a defined period of time and then a signal related to light intensity is generated from the quantity of electric charges accumulated in the capacitor. When a capacitor is used as described above, a sensing time may be delayed by as long as the time for accumulating electric charges in the capacitor. In addition, a larger-sized optical touch screen device may lead to a higher parasitic capacitance.

SUMMARY

Provided are a light-sensing apparatus that uses an oxide semiconductor transistor as a light-sensing device, a method of driving the light-sensing apparatus, and/or an optical touch screen apparatus including the light-sensing apparatus.

According to one or more example embodiments, a light-sensing apparatus includes a light sensor transistor configured to sense light; a switch transistor configured to output a light-sensing signal from the light sensor transistor; a gate line connected to a gate of the switch transistor; a reset line connected to a gate of the light sensor transistor; and a phase inverter connected between the reset line and the gate line such that signals that have inverted phases are applied to the switch transistor and the light sensor transistor, respectively, at a same time.

In some embodiments an input terminal of the phase inverter may be connected to the gate line, and an output terminal thereof may be connected to the reset line.

In some embodiments the switch transistor and the light sensor transistor may be connected in series.

In some embodiments the light sensor transistor may include an oxide semiconductor transistor that includes an oxide semiconductor as a material of a channel layer.

In some embodiments the oxide semiconductor transistor may include a substrate; a gate partially disposed on the substrate; a gate insulation film disposed on the substrate and the gate to cover at least the gate; a channel layer disposed on the gate insulation film to face the gate and formed of an oxide semiconductor material; a source and a drain disposed to cover opposite sides of the channel layer; and a transparent insulation layer disposed to cover the source, the drain, and the channel layer.

The oxide semiconductor material may include ZnO, InO, SnO, InZnO, ZnSnO, or InSnO, or a mixed material of these oxide semiconductor materials with at least one of the group consisting of hafnium (Hf), zirconium (Zr), titanium (Ti), tantalum (Ta), gallium (Ga), niobium (Nb), vanadium (V), aluminium (Al), and tin (Sn).

According to at least one other example embodiment, a light-sensing apparatus includes: a light-sensing pixel array including a plurality of light-sensing pixels arranged in rows and columns; a gate driver configured to provide the light-sensing pixels with a gate voltage and a reset signal that have inverted phases; and a signal output unit configured to receive a light-sensing signal from the light-sensing pixels and output a data signal, wherein each of the light-sensing pixels includes a light sensor transistor configured to sense light and a switch transistor for outputting a light-sensing signal from the light-sensor transistor, the gate driver includes, a plurality of gate lines connected to gates of the switch transistors, a plurality of reset lines connected to gates of the light sensor transistors, and a plurality of phase inverters each connected between a corresponding reset line and a gate line.

In some embodiments an input terminal of the phase inverters may be connected to a corresponding gate line, and an output terminal thereof may be connected to a corresponding reset line.

In some embodiments a gate voltage and a reset signal that have inverted phases may be respectively applied to the switch transistors and the light sensor transistors in a same row at a same time.

In some embodiments the gate lines may be directly connected to the gate driver, and the reset lines may be indirectly connected to the gate driver via the phase inverters and the gate lines.

In some embodiments the switch transistors and the light sensor transistors in a same row may be connected in series.

In some embodiments each of the gate lines and each of the reset lines may be connected to the light-sensing pixels in a same row.

In some embodiments the signal output unit may include a plurality of data lines arranged in a column direction.

In some embodiments the light sensor transistors include a oxide semiconductor transistor having an oxide semiconductor as a material of a channel layer.

In some embodiments each of the data lines may be connected to the light-sensing pixels arranged in the same column, wherein each of the data lines may be connected to sources of the switch transistors of the light-sensing pixels in the same column.

According to at least one other example embodiment, an optical touch screen apparatus includes a pixel array including a plurality of display pixels and a plurality of light-sensing pixels that are arranged in rows and columns; a plurality of gate lines arranged in a row direction and configured to provide a gate voltage to the display pixels and the light-sensing pixels; a plurality of reset lines arranged in the row direction and configured to provide a reset signal to the light-sensing pixels; and a plurality of phase inverters each connected between corresponding reset lines and gate lines, wherein each of the display pixels includes a display cell and a first switch transistor for controlling turning ON or OFF of the display cell; each of the light-sensing pixels includes a light sensor transistor configured to sense light, and a second switch transistor configured to output a light-sensing signal from the light sensor transistor; and the first switch transistors, the second switch transistors, and the light sensor transistors are configured such that the first switch transistor receives a gate voltage, the second switch transistor receives the gate voltage and the light sensor transistors in a same row receive a reset signal at a same time, the gate voltage and the reset signal having phases that are inverted from one another.

In some embodiments the optical touch screen apparatus may further include a gate driver configured to sequentially provide a gate voltage to the plurality of gate lines; a signal output unit including a plurality of data lines arranged in a column direction and configured to receive a light-sensing signal from the light-sensing pixels and outputting a data signal; and a data driver including a plurality of image data lines arranged in a column direction and configured to provide an image signal to the display pixels.

In some embodiments the gate lines may be directly connected to the gate driver, and the reset lines may be indirectly connected to the gate driver via the phase inverters and the gate lines.

In some embodiments each of the gate lines may be connected to the display pixels and the light-sensing pixels in the same row, wherein each of the gate lines may be connected to gates of the first switch transistors in the same row and gates of the second switch transistors of the light-sensing pixels in that same row.

In some embodiments each of the reset lines may be connected to the light-sensing pixels in the same row, wherein each of the reset lines may be connected to gates of the light sensor transistors of the light-sensing pixels in the same row.

According to at least one other example embodiment, a method of operating a light-sensing apparatus that includes a plurality of light-sensing pixels arranged in rows and columns, each light-sensing pixel including a light sensor transistor configured to sense light and a switch transistor configured to output a light-sensing signal from the light sensor transistor, the method including applying a positive first gate voltage to gates of the switch transistors of the light-sensing pixels in one of the rows, and at a same time applying a negative second gate voltage to gates of the light sensor transistors of the light-sensing pixels in a same row, the positive first gate voltage being greater than or equal to a threshold voltage, and the negative second gate voltage having an inverted phase with respect to the positive first gate voltage.

The method may further include applying a negative second gate voltage to gates of the switch transistors of the light-sensing pixels in the rest of the rows and at the same time applying a positive first gate voltage to gates of the light sensor transistors of the light-sensing pixels in the rest of the rows, the negative second gate voltage being less than the threshold voltage, and the positive first gate voltage having an inverted phase with respect to the negative second gate voltage.

In some embodiments the method may further include inverting the positive gate voltage using a phase inverter to obtain the negative second gate voltage, the negative second gate voltage having an inverted phase with respect to the positive first gate voltage.

BRIEF DESCRIPTION OF THE DRAWINGS

These and/or other aspects will become apparent and more readily appreciated from the following description of the embodiments, taken in conjunction with the accompanying drawings in which:

FIG. 6 is a block diagram schematically illustrating an overall structure of a light-sensing apparatus according to an example embodiment including the light-sensing pixel of FIG. 4;

DETAILED DESCRIPTION

Figure 1:
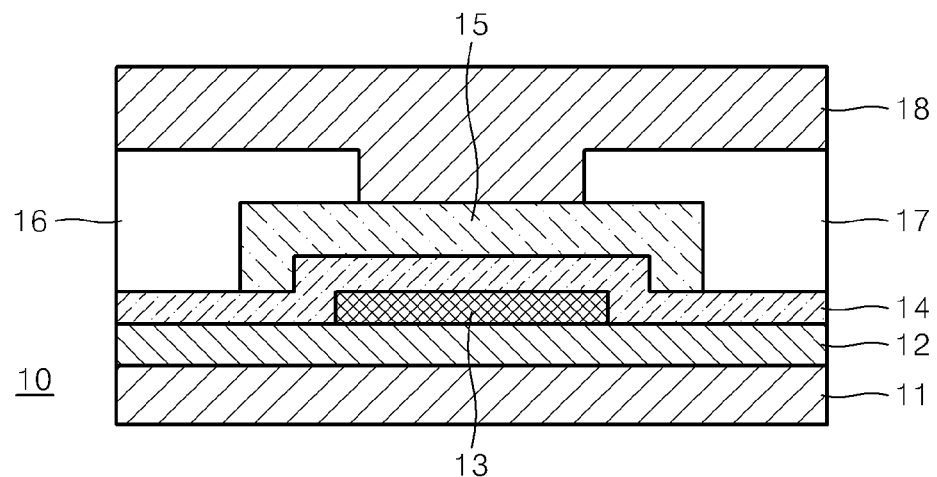
FIG. 1 is a cross-sectional view schematically illustrating an oxide semiconductor transistor according to an example embodiment.

Various embodiments will now be described more fully with reference to the accompanying drawings in which some embodiments are shown. These example embodiments may, however, be embodied in different forms and should not be construed as limited to the embodiments set forth herein. Rather, these embodiments are provided so that this disclosure is thorough and complete and fully conveys the example embodiments to those skilled in the art.

It will be understood that when an element or layer is referred to as being "on," "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

The terminology used herein is for the purpose of describing particular embodiments only and is not intended to be limiting the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, quantities, steps, operations, elements, and/or components, but do not preclude the presence or addition of one or more other features, quantities, steps, operations, elements, components, and/or groups thereof.

Unless otherwise defined, all terms (including technical and scientific terms) used herein have the same meanings as commonly understood by one of ordinary skill in the art to which the example embodiments belong. It will be further understood that terms in common usage should be interpreted within the context of the relevant art and not in an idealized or overly formal sense unless expressly so defined herein.

Hereinafter, example embodiments will be described with reference to the drawings.

An oxide semiconductor transistor is a transistor in which an oxide semiconductor is used as a material for a channel. The oxide semiconductor transistor may have a characteristic of being sensitive to light according to a material for an oxide semiconductor that is used as a channel layer. When an oxide semiconductor material having such a characteristic is used as a channel layer, an oxide semiconductor transistor has a characteristic that a threshold voltage and a drain current change according to a wavelength or quantity of incident light. Accordingly, the oxide semiconductor transistor may be used as a light-sensing device.

FIG. 1 is a cross-sectional view schematically illustrating an oxide semiconductor transistor 10 according to an example embodiment. Referring to FIG. 1, the oxide semiconductor transistor 10 may include a substrate 11, an insulation layer 12 disposed on the substrate 11, a gate 13 partially disposed on the insulation layer 12, a gate insulation film 14 disposed on the insulation layer 12 and the gate 13 to cover at least the gate 13, a channel layer 15 disposed on the gate insulation film 14 to face the gate 13, a source 16 and a drain 17 disposed to cover opposite sides of the channel layer 15, and a transparent insulation layer 18 disposed to cover the source 16, the drain 17, and the channel layer 15. Although the oxide semiconductor transistor 10 of FIG. 1 has a bottom gate structure with the gate 13 disposed below the channel layer 15, the oxide semiconductor transistor 10 may also have a top-gate structure.

The substrate 11 may use a general substrate material, for example, glass, silicon, or the like. The insulation layer 12, the gate insulation film 14, and the transparent insulation layer 18 may use a material such as SiO2. When the substrate 11 is formed of an insulation material, the insulation layer 12 on the substrate 11 may be omitted. Also, the gate 13, the source 16, and the drain 17 may use a conductive metal or conductive metal oxide. For example, the oxide semiconductor transistor 10 that is sensitive to light is used in an optical touch panel that is attachable to a display panel. The gate 13, the source 16, and the drain 17 may be formed of a transparent conductive material such as indium tin oxide (ITO). However, when the oxide semiconductor transistor 10 is not transparent, materials for the substrate 11, the insulation layer 12, the gate 13, the gate insulation film 14, the source 16, and the drain 17 may not be transparent. However, only the transparent insulation layer 18 in the upper portion of the oxide semiconductor transistor 10 is transparent in order to guide light toward the channel layer 15.

The channel layer 15 may be formed of an oxide semiconductor material, as described above. The oxide semiconductor transistor 10 may have a light sensitive characteristic depending on the oxide semiconductor material used for the channel layer 15. For example, an oxide semiconductor material such as ZnO, InO, SnO, InZnO, ZnSnO, and InSnO may be used as an oxide semiconductor channel material, or a mixed material of these oxide semiconductor materials with at least one of the group consisting of hafnium (Hf), zirconium (Zr), titanium (Ti), tantalum (Ta), gallium (Ga), niobium (Nb), vanadium (V), aluminium (Al), and tin (Sn) may be used as the oxide semiconductor channel material. When these materials are used to form the channel layer 15, the oxide semiconductor transistor 10 of FIG. 1 may have a varying threshold voltage and a varying drain current that depends on the wavelength or quantity of incident light, and thus may be used as a light-sensing device. A wavelength range of light sensed by the oxide semiconductor transistor 10 may vary depending on the kind of oxide semiconductor used in the channel layer 15. The channel layer 15 may be formed of a single oxide semiconductor layer or may have a multilayer structure.

Figure 2:
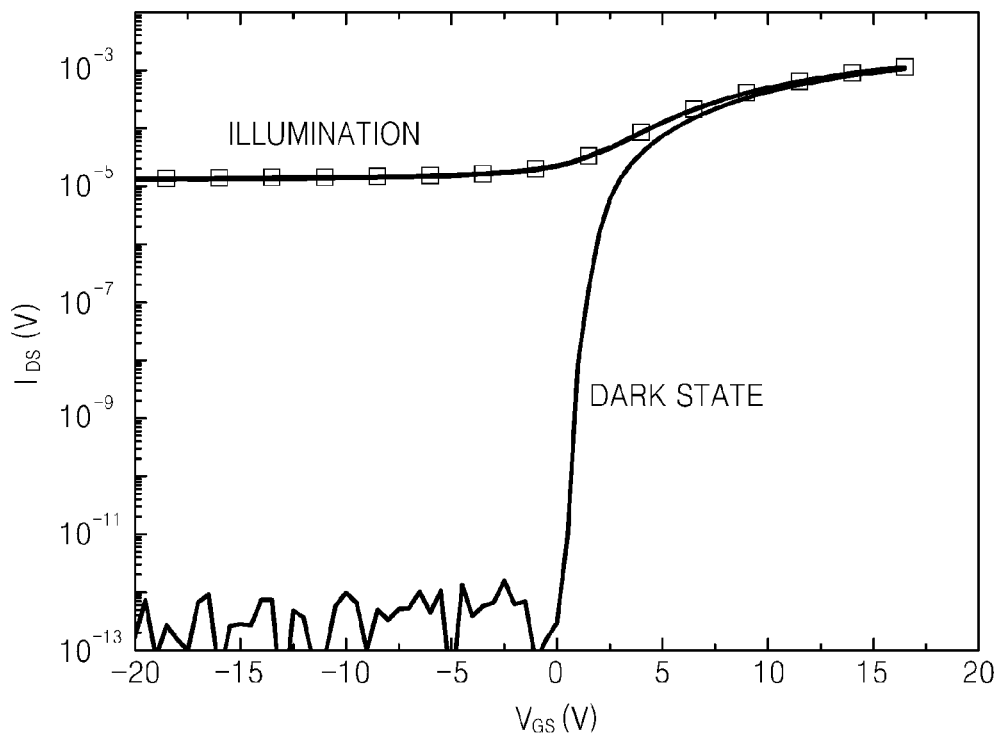
FIGS. 2 and 3 are graphs showing operation characteristics of the oxide semiconductor transistor of FIG. 1.
Figure 3:
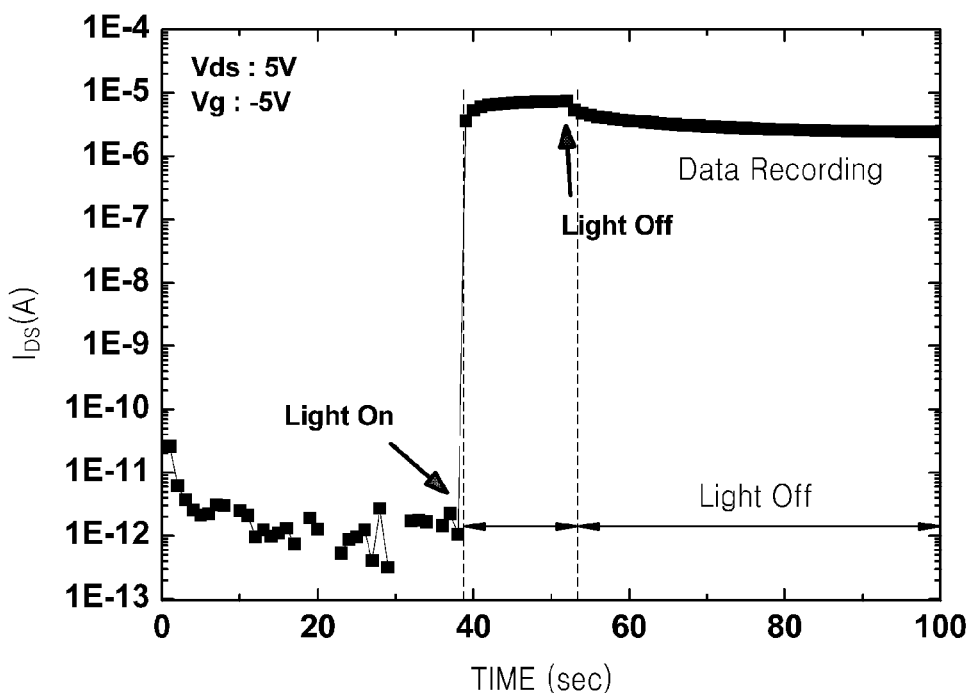

FIGS. 2 and 3 are graphs illustrating operational characteristics of the oxide semiconductor transistor 10 of FIG. 1, according to an example embodiment. First, referring to FIG. 2, which shows drain current (IDS) characteristics with respect to a gate voltage (VGS) of the oxide semiconductor transistor 10, when the oxide semiconductor transistor 10 is turned off as light is incident thereon, the drain current (IDS) is increased. For example, when a gate voltage greater than a threshold voltage is applied to the oxide semiconductor transistor 10, a drain current (IDS) when light is incident and a drain current (IDS) when light is not incident are nearly the same, as shown in a right-hand side of FIG. 2. However, when a gate voltage below a threshold voltage is applied to the oxide semiconductor transistor 10, a drain current (IDS) when light is incident is remarkably higher that that when light is not incident, as shown in a left-hand side of FIG. 2.

Therefore, a determination as to whether light is incident may be made by measuring the drain current when a gate voltage below a threshold voltage is applied to the oxide semiconductor transistor 10. In particular, in the case of the oxide semiconductor transistor 10, a current ratio (ION/IOFF) between the drain current when light is incident and the drain current when light is not incident is considerably high. The oxide semiconductor transistor 10 having these characteristics may provide diverse advantages when used as a light-sensing device. One such advantage of the oxide semiconductor transistor 10 is a light-sensing device may be manufactured without a capacitor due to the high current ratio obtained when using the oxide semiconductor transistor 10 as a light-sensing device.

FIG. 3 is a graph showing drain current change with respect to time in the oxide semiconductor transistor after light is incident on the oxide semiconductor transistor. Referring to FIG. 3, the drain current is increased when light is incident on the oxide semiconductor transistor at about 40 seconds and substantially remains at almost the same level with nearly no reduction in drain current even after the incident light is blocked for roughly 55 seconds. This constant drain current results because electric charges are trapped in or at an interface surface of the channel layer 15 of the oxide semiconductor transistor 10. For example, when a negative gate voltage is applied along with light to the oxide semiconductor transistor 10, holes generated by the light in the channel layer 15 may migrate to an interface between the gate insulation film 14 and the channel layer 15 and be trapped therein. The trapped electric charges may remain until a sufficiently high positive (+) voltage is applied to the gate 13. However, this phenomenon may disappear if the trapped electric charges are removed when a sufficiently high gate voltage is applied to the oxide semiconductor transistor 10.

Figure 4:
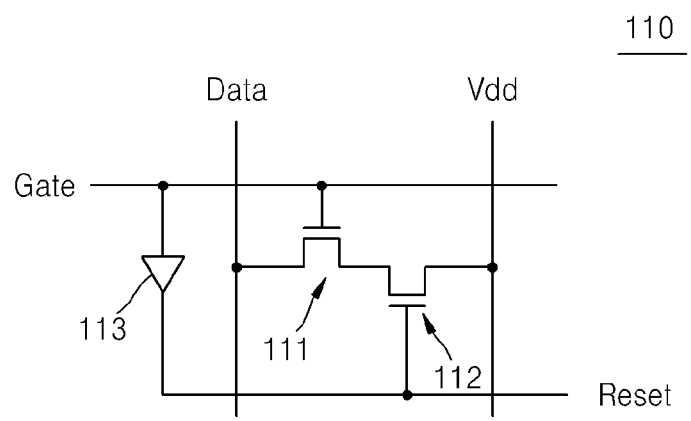
FIG. 4 is a circuit diagram illustrating a light-sensing pixel in a light-sensing apparatus according to an example embodiment.

FIG. 4 is a circuit diagram illustrating a light-sensing pixel 110 in a light-sensing apparatus according to an example embodiment employing the oxide semiconductor transistor 10. Referring to FIG. 4, the light-sensing pixel 110 may include one light sensor transistor 112 and one switch transistor 111 that are connected in series. In other words, a source of the light sensor transistor 112 may be connected to a drain of the switch transistor 111. The light sensor transistor 112 as a light-sensing device for sensing light may be, for example, the oxide semiconductor transistor 10. The switch transistor 111 for outputting a light-sensing signal may be a general thin-film transistor (TFT) without light sensitivity. Furthermore, as shown in FIG. 4, the light-sensing pixel 110 may further include a gate line Gate connected to a gate of the switch transistor 111, a data line Data connected to a source of the switch transistor 111, a driving voltage line Vdd connected to a drain of the light sensor transistor 112, a reset line Reset connected to a gate of the light sensor transistor 112, and a phase inverter 113 connected between the reset line Reset and the gate line Gate. In an embodiment, an input terminal of the phase inverter 113 may be connected to the gate line Gate, and an output terminal thereof may be connected to the reset line Reset, so that a gate voltage applied to the gate line Gate may be provided to the reset line Reset via phase inversion. The phase inverter 113 may be, for example, an inverter.

To read out a light-sensing signal from the light-sensing pixel 110 having the aforementioned structure, a gate voltage that is equal to or greater than a threshold voltage may be applied to the switch transistor 111 via the gate line Gate. As a result, the switch transistor 111 is turned ON. The gate voltage that is greater than or equal to the threshold voltage and applied through the gate line gate is provided to the reset line Reset with a phase inverted by the phase inverter 113. In other words, while a positive (+) gate voltage greater than or equal to the threshold voltage is applied to the gate line, a negative (−) gate voltage less than the threshold voltage is applied to the reset line Reset. In this state the light-sensing transistor 112 is turned OFF. When the light-sensing transistor 112 is turned off, a current flows from the source of the light sensor transistor 112 to the data line Data. The amount of current that flows from the light sensor transistor 112 to the data line Data varies according to the intensity of light incident on the light sensor transistor 112. Therefore, the intensity of light incident on the light sensor transistor 112 may be calculated by measuring the amount of a current that flows through the data line Data. However, if a gate voltage less than the threshold voltage is applied to the switch transistor 111, the switch transistor 111 is turned OFF, and thus no current flows in the data line Data. In an embodiment, a negative (−) gate voltage less than the threshold voltage may be applied to the gate line Gate. Therefore, a light-sensing signal may be output from the light-sensing pixel 110 by ON/OFF control of the switch transistor 111, and the incidence of light on the light sensor transistor 112 and the intensity of the light may be determined based on the strength of the light-sensing signal.

When a negative (−) gate voltage less than the threshold voltage is applied to the gate line Gate, the phase inverter 113 may apply a phase inverted positive (+) gate voltage to the reset line Reset. This positive gate voltage may serve as a reset signal to reset and initialize the light-sensing transistor 112. As described above, electric charges may be trapped in the interface between the gate insulating layer and the channel layer as light is incident on the light-sensing transistor 112, so that the drain current of the light sensor transistor 112 may remain at almost a same level without a reduction even when light is no longer incident, until the trapped electric charges are removed. For this reason, after a measurement of light in the light-sensing pixel 110, a reset process may be performed to remove the trapped electric charges by applying a positive reset signal to the light-sensing transistor 112.

Figure 5:
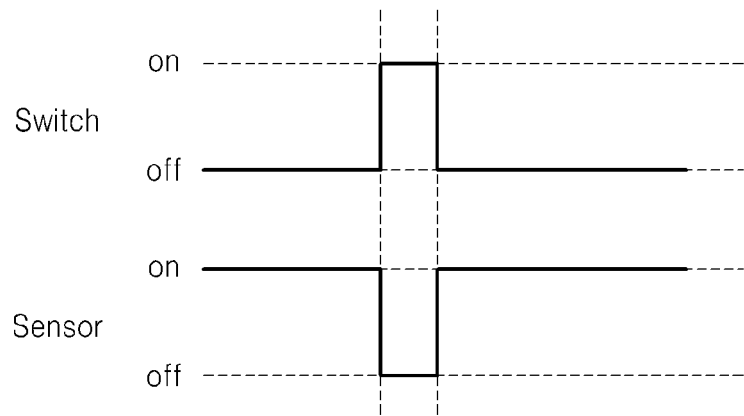
FIG. 5 is a timing diagram illustrating an example operation of the light-sensing pixel of FIG. 4.

In an example embodiment, since the reset line Reset is connected to the gate line Gate via the phase inverter 113, signals applied to the reset line Reset and the gate line Gate respectively may have inverted phases. As shown in the timing diagram of FIG. 5, while the switch transistor 111 is turned OFF, a positive gate voltage is applied to the light-sensing transistor 112 to reset for a next measurement. However, while the switch transistor 111 is turned ON, the light-sensing transistor 112 is turned OFF, and thus a drain current in the light-sensing transistor 112 may vary depending on the incidence of light or not.

FIG. 6 includes a schematic block diagram and a timing diagram. The left side of FIG. 6 is the schematic block diagram illustrating an overall structure of a light-sensing apparatus 100 according to an example embodiment, which includes the light-sensing pixel 110 of FIG. 4. Referring to FIG. 6, the light-sensing apparatus 100 may include a light-sensing pixel array that has a plurality of light-sensing pixels 110 for sensing incident light, a gate driver 120 for sequentially providing a gate voltage and a reset signal to each of the light-sensing pixels 110, and a signal output unit 130 for receiving a light-sensing signal from each of the light-sensing pixels 110 and outputting a data signal. As shown in FIG. 6, the light-sensing pixels 110 in the light-sensing pixel array may be arranged in rows and columns. For example, the light-sensing pixels 110 may be arranged in an array of n rows and m columns.

The gate driver 120 may activate the light-sensing pixels 110 individually to control each of the light-sensing pixels 110 to output a light-sensing signal. To this end, the gate driver 120 may include a plurality of gate lines Gate 1 to Gate n that are arranged in a row direction. Each of the gate lines Gate 1 to Gate n may be connected to gates of switch transistors 111 of the light-sensing pixels 110 arranged in the same row. For example, the gate line Gate 1 may be connected to gates of the switch transistors 111 of the light-sensing pixels 110 arranged in a first row, and an nth gate line Gate n may be connected to gates of the switch transistors 111 of the light-sensing pixels 110 arranged in an nth row.

The gate driver 120 may further include a plurality of reset lines Reset 1 to Reset n arranged in the row direction and which are each connected to a corresponding gate line Gate 1, Gate 2, ..., or Gate n. For example, the reset line Reset 1 may be connected to the gate line Gate 1 via the phase inverter 113, and the nth reset line Reset n is connected to the nth gate line Gate n via the phase inverter 113. In other words, only the gate lines Gate 1 to Gate n are directly connected to the gate driver 120, and the reset lines Reset 1 to Reset n may be indirectly connected to the gate driver 120 via the phase inverter 113 and the gate lines Gate 1 to Gate n. Thus, the gate driver 120 may provide a gate voltage and a reset signal that have inverted phases to the gate lines Gate 1 to Gate n and the reset lines Reset 1 to Reset n.

Each of the reset lines Reset 1 to Reset n may provide to corresponding light-sensing pixels 110 a reset signal for resetting a light-sensing transistor in each of the light-sensing pixels 100. To this end, each of the reset lines Reset 1 to Reset n may be connected to the gates of the light-sensing transistors 112 in the light-sensing pixels 110 arranged in the same row. For example, the reset line Reset 1 may be connected to the gates of the light-sensing transistors 112 in the light-sensing pixels 110 arranged in a first row, and the nth reset line Reset n may be connected to the gates of the light sensor transistors 112 in the light sensing pixels 110 arranged in an nth row.

The signal output unit 130 receives light-sensing signals from the light-sensing pixels 110 and outputs data signals. To this end, the signal output unit 130 may include a plurality of data lines Data 1 to Data n that are arranged in a column direction. Each of the data lines Data 1 to Data n may be connected to sources of the switch transistors 111 in the light-sensing pixels 110 arranged in the same column. For example, the data line Data 1 may be connected to sources of the switch transistors 111 in the light-sensing pixels 110 arranged in a first column, and the data line Data 2 may be connected to sources of the switch transistors 111 in the light-sensing pixels 110 arranged in a second column. In this structure, the signal output unit 130 may simultaneously receive all light-sensing signals generated in the light-sensing pixels 110 arranged in the same row via the data lines Data 1 to Data n.

Hereinafter, an operation of the light-sensing apparatus 100 will be described. The right side of FIG. 6 is a timing diagram of an operation of a example embodiment of the light-sensing apparatus 100. Referring to the timing diagram of FIG. 6, the gate driver 120 applies a positive gate voltage greater than or equal to a threshold voltage of the switch transistor 111 to the gate line Gate 1, so that the light-sensing pixels 110 in the first row output light-sensing signals. A negative gate voltage less than the threshold voltage of the switch transistor 111 is applied to the rest of the gate lines, namely, the gate line Gate 2 to the nth gate line Gate n, so that no light-sensing signal is output from these gate lines. A negative gate voltage with a phase inverted by the phase inverter 113 is applied to the reset line Reset 1, so that the light-sensing transistors 112 in the light-sensing pixels 110 arranged in the first row are turned OFF, and a drain current of the light-sensing transistors 112 varies depending on the incidence of light or not. A positive gate voltage is applied to the light-sensing transistors 112 in the light-sensing pixels 110 arranged in the remaining rows, so that the light-sensing transistors 112 are reset.

Then, the gate driver 120 applies a positive gate voltage greater than or equal to the threshold voltage of the switch transistor 111 to the gate line Gate 2, so that the light-sensing pixels 110 in the second row output light-sensing signals. A negative gate voltage less than the threshold voltage of the switch transistor 111 is applied to the rest of the gate lines. At the same time, the negative gate voltage is applied via the phase inverter 113 to the reset line Reset 2 connected to the gate line Gate 2, so that the light-sensing transistors 112 in the light-sensing pixels 110 arranged in the second row are turned OFF, and a drain current of the light-sensing transistors 112 varies depending on the incidence of light or not. A positive gate voltage is applied to the light-sensing transistors 112 in the light-sensing pixels 110 arranged in the remaining rows, so that the light-sensing transistors 112 are reset. Light-sensing signals may be sequentially output from the light-sensing pixels 110, beginning from the first row to the nth row and in this manner a light sensing operation for a single frame is completed. Once the light sensing operation for a single frame is completed, light sensing operations for next frames may be repeated in the order as described above.

In one or more example embodiments, no separate driving circuits for individually driving the switch transistor 111 and the light sensor transistor 112 are used. That is, the switch transistors 111 and the light sensor transistors 112 may be both controlled using only one gate driver 120 that provides signals to the gate lines Gate 1 to Gate n. In particular, in resetting the light sensor transistors 112 the reset lines Reset 1 to Reset n may not be heavily loaded. Furthermore, additional complicated wirings for the reset lines Reset 1 to Reset n are unnecessary. Therefore, with a simplified configuration of the light-sensing apparatus 100, advantages such as improved space utilization, reduced manufacturing cost, and reduced power consumption may be acquired. This may be advantageous in enlarging the light-sensing apparatus 100.

Figure 7:
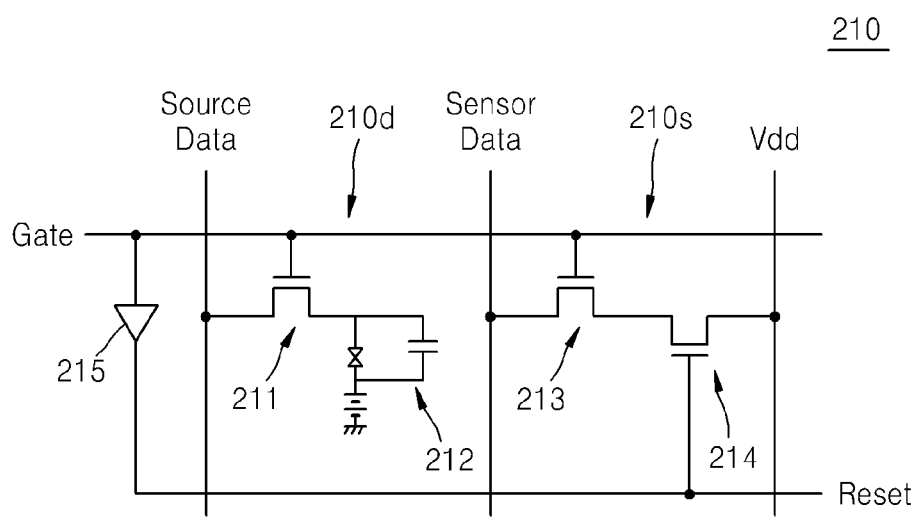
FIG. 7 is a circuit diagram illustrating an example structure of a pixel in an optical touch screen apparatus according to an example embodiment.

Due to the space utilization efficiency, it may be easy to embody an in-cell type optical touch screen apparatus in which display pixels and light-sensing pixels are integrated, respectively. FIG. 7 is a circuit diagram showing a pixel 210 of an in-cell type optical touch screen apparatus.

Referring to FIG. 7, the pixel 210 of an in-cell type optical touch screen apparatus includes a display pixel 210$d$ and a light-sensing pixel 210$s$. The display pixel 210$d$ may include a display cell 212 (e.g., a liquid crystal cell in the case of a liquid crystal display apparatus) and a first switch transistor 211 for turning the display cell 212 on or off. The light-sensing pixel 210$s$ may include a light sensor transistor 214 for sensing incident light and a second switch transistor 213 for outputting a light-sensing signal from the light sensor transistor 214. The first and second switch transistors 211 and 213, respectively, may be connected to a single common gate line Gate. A drain of the first switch transistor 211 may be connected to an image data line Source-Data, whereas a source of the first switch transistor 211 may be connected to the display cell 212. A source of the second switch transistor 213 may be connected to a light-sensing data line Sensor-Data, whereas a drain of the second switch transistor 213 may be connected to a source of the light sensor transistor 214. Furthermore, a drain of the light sensor transistor 214 may be connected to a driving voltage line Vdd, whereas a gate of the light sensor transistor 214 may be connected to a reset line Reset. The reset line Reset may be connected to the gate line Gate via a phase inverter 215.

In the structure illustrated in FIG. 7, when a positive gate voltage is applied to the gate line Gate, the first and second switch transistors 211 and 213, respectively, are turned ON, while the light sensor transistor 214 is turned OFF. Then, the display cell 212 displays an image according to an image signal from the image data line Source-Data, and a light-sensing signal is output from the light-sensing data line Sensor-Data depending on the intensity of incident light. When a negative gate voltage is applied to the gate line Gate, the first and second switch transistors 211 and 213, respectively, are turned OFF, while the light sensor transistor 214 is turned ON. In this state displaying of an image and outputting of a light-sensing signal are interrupted, and the light sensor transistor 214 is reset.

Figure 8:
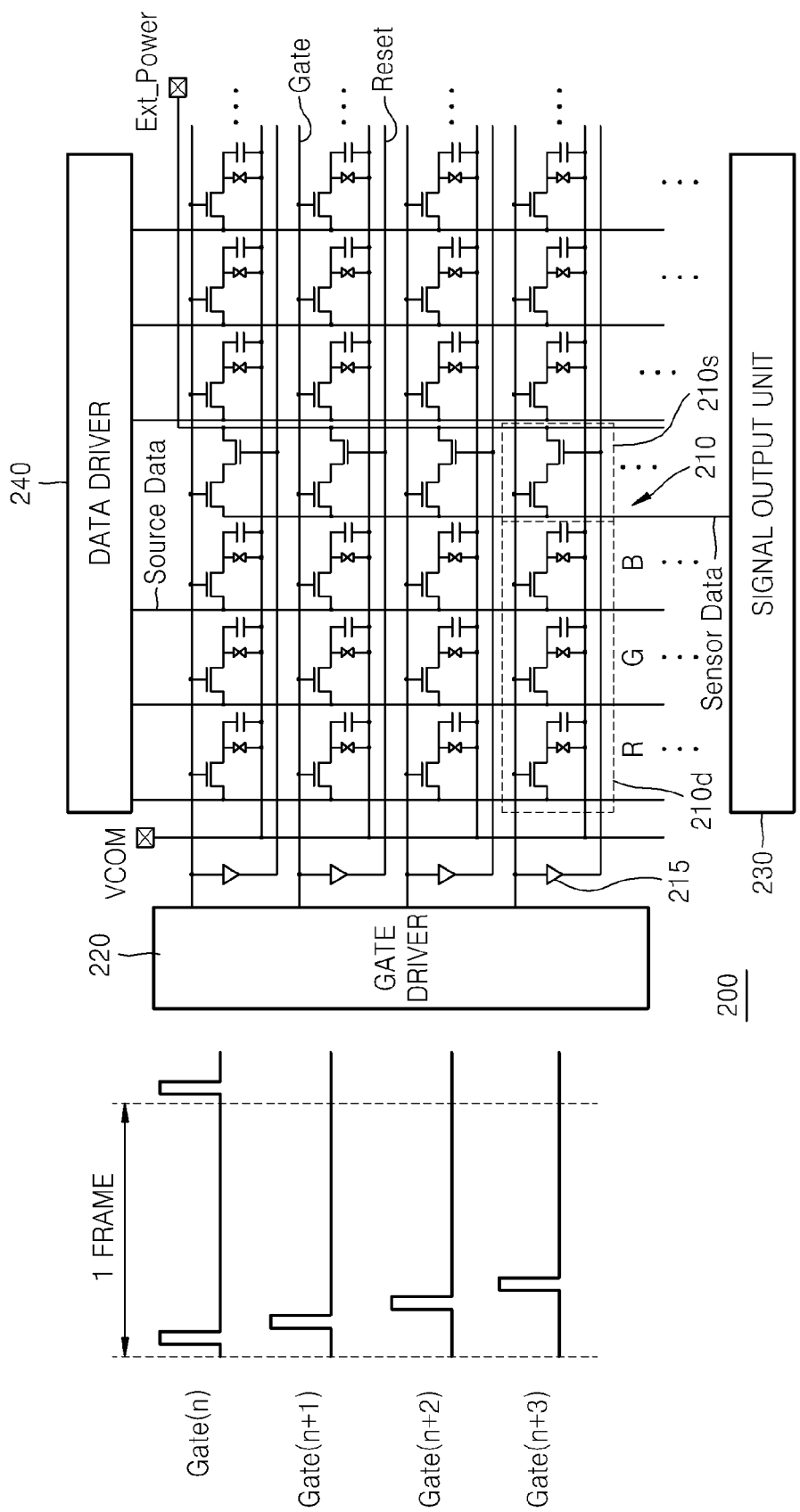
FIG. 8 schematically illustrates an overall structure of an optical touchscreen apparatus according to an example embodiment including the pixel of FIG. 7.

FIG. 8 is a block diagram showing an overall structure of an in-cell type optical touch screen apparatus 200 including an array of pixels 210, one of which is shown in FIG. 7. Referring to FIG. 8, the in-cell type optical touch screen apparatus 200 includes an array of the pixels 210 including display pixels 210d for displaying images and light-sensing pixels 210s for sensing incident light, a gate driver 220 for providing a gate voltage to each of the display pixels 210d and the light-sensing pixels 210s, a data driver 240 for providing an image signal to each of the display pixels 210d, and a signal output unit 230 for receiving a light-sensing signal from each of the light-sensing pixels 210s and outputting a data signal.

As illustrated in FIG. 8, the display pixels 210d and the light-sensing pixels 210s may be arranged in rows and columns. Even though one light-sensing pixel 210s may arranged with respect to one display pixel 210d, the example embodiment illustrated in FIG. 8 shows that one light-sensing pixel 210s is arranged with respect to the plurality of display pixels 210d. In a general display panel, each pixel has a width and a height from about 200 μm to about 300 μm, whereas incident light has a beam diameter of around 2 mm, which is far larger than the size of the pixel. Therefore, even if the light-sensing pixels 210s are only partially arranged in the array of the pixels 210, a location of incidence of light may be specified. Each of the display pixels 210d may include a red sub-pixel R, a green sub-pixel G, and a blue sub-pixel B for displaying colors.

The gate driver 220 may include a plurality of gate lines Gate arranged in a row direction, a plurality of reset lines Reset arranged in the row direction, and a phase inverter 215 connected between each of the reset lines Reset and a corresponding gate line Gate. Each of the gate lines Gate may be connected to the gates of first switch transistors 211 in the display pixels 210d arranged in the same row and gates of second switch transistors 213 in the light-sensing pixels 210s arranged in the same row. In the case of each display pixel 210d including three sub-pixels, namely, the red, green, and blue sub-pixels R, G, and B, the display pixel 210d may include three first switch transistors 211. As shown in FIG. 8, a gate line Gate may be connected to the gates of the first switch transistors 211 in the three sub-pixels, namely, the red, green, and blue sub-pixels R, G, and B, in the same row. Each of the reset lines Reset may be connected to the gates of light sensor transistors 214 in the light sensing pixels 210s arranged in the same row. As described above, since each of the reset lines Reset is connected to a corresponding gate line Gate via the phase inverter 215, signals that have inverted phases are applied to the reset line Reset and the gate line Gate, respectively, at the same time.

The signal output unit 230 may include a plurality of light-sensing data lines Sensor-Data that are arranged in a column direction. Each of the light-sensing data lines Sensor-Data may be connected to the light-sensing pixels 210s arranged in the same column. In particular, each of the light-sensing data lines Sensor-Data may be connected to sources of the second switch transistors 213 arranged in the same column. The signal output unit 230 may receive light-sensing signals from the light sensor transistors 214 in the light-sensing pixels 210s via the light-sensing data lines Sensor-Data, process the light-sensing signals, and output digital data signals.

The data driver 240 may include the plurality of image data lines Source-Data arranged in a column direction. Each of the image data lines Source-Data may be connected to the display pixels 210 arranged in the same column. The data driver 240 provides image signals to be displayed to the display pixels 210 via the image data lines Source-Data, respectively. If each display pixel 210d includes three sub-pixels, namely, the red, green, and blue sub-pixels R, G, and B, the data driver 240 may include separate image data lines respectively connected to the red, green, and blue sub-pixels R, G, and B.

As described above, according to the one or more of the above embodiments, a light-sensing apparatus, a method of driving the light-sensing apparatus, and an optical touch screen apparatus including the light-sensing apparatus are described and illustrated. It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A light-sensing apparatus comprising:
   a light sensor transistor configured to sense light;
   a switch transistor configured to output a light-sensing signal from the light sensor transistor;
   a gate line connected to a gate of the switch transistor;
   a reset line connected to a gate of the light sensor transistor; and
   a phase inverter connected between the reset line and the gate line such that signals that have inverted phases are applied to the switch transistor and the light sensor transistor, respectively, at a same time.

2. The light-sensing apparatus of claim 1, wherein an input terminal of the phase inverter is connected to the gate line, and an output terminal thereof is connected to the reset line.

3. The light-sensing apparatus of claim 1, wherein the switch transistor and the light sensor transistor are connected in series.

4. The light-sensing apparatus of claim 1, wherein the light sensor transistor comprises an oxide semiconductor transistor including an oxide semiconductor as a material of a channel layer.

5. The light-sensing apparatus of claim 4, wherein the oxide semiconductor transistor comprises:
   a substrate;
   a gate partially disposed on the substrate;
   a gate insulation film disposed on the substrate and the gate to cover at least the gate;
   a channel layer disposed on the gate insulation film to face the gate and formed of an oxide semiconductor material;
   a source and a drain disposed to cover opposite sides of the channel layer; and
   a transparent insulation layer disposed to cover the source, the drain, and the channel layer.

6. The light-sensing apparatus of claim 5, wherein the oxide semiconductor material comprises ZnO, InO, SnO, InZnO, ZnSnO, or InSnO, or a mixed material of these oxide semiconductor materials with at least one of the group consisting of hafnium (Hf), zirconium (Zr), titanium (Ti), tantalum (Ta), gallium (Ga), niobium (Nb), vanadium (V), aluminum (Al), and tin (Sn).

7. A light-sensing apparatus comprising:
   a light-sensing pixel array including a plurality of light-sensing pixels arranged in rows and columns;
   a gate driver configured to provide the light-sensing pixels with a gate voltage and a reset signal that have inverted phases; and
   a signal output unit configured to receive a light-sensing signal from the light-sensing pixels and output a data signal, wherein
   each of the light-sensing pixels includes a light sensor transistor configured to sense light and a switch transistor configured to output a light-sensing signal from the light-sensor transistor,
   the gate driver includes,
      a plurality of gate lines connected to gates of the switch transistors,
      a plurality of reset lines connected to gates of the light sensor transistors, and a plurality of phase inverters each connected between a corresponding reset line and a gate line.

8. The light-sensing apparatus of claim 7, wherein an input terminal of each of the phase inverters is connected to a corresponding gate line, and an output terminal of each of the phase inverters is connected to a corresponding reset line.

9. The light-sensing apparatus of claim 8, wherein a gate voltage and a reset signal that have inverted phases are respectively applied to the switch transistors and the light sensor transistors in a same row at a same time.

10. The light-sensing apparatus of claim 8, wherein the gate lines are directly connected to the gate driver, and the reset lines are indirectly connected to the gate driver via the phase inverters and the gate lines.

11. The light-sensing apparatus of claim 7, wherein the switch transistors and the light sensor transistors in a same row are connected in series.

12. The light-sensing apparatus of claim 7, wherein each of the gate lines and each of the reset lines are connected to the light-sensing pixels in a same row.

13. The light-sensing apparatus of claim 7, wherein the signal output unit comprises a plurality of data lines arranged in a column direction.

14. The light-sensing apparatus of claim 13, wherein each of the data lines is connected to the light-sensing pixels arranged in the same column, wherein each of the data lines is connected to sources of the switch transistors of the light-sensing pixels in the same column.

15. The light-sensing apparatus of claim 7, wherein the light sensor transistors comprise an oxide semiconductor transistor including an oxide semiconductor as a material of a channel layer.

16. An optical touch screen apparatus comprising:
a pixel array including a plurality of display pixels and a plurality of light-sensing pixels that are arranged in rows and columns;
a plurality of gate lines arranged in a row direction and configured to provide a gate voltage to the display pixels and the light-sensing pixels;
a plurality of reset lines arranged in the row direction and configured to provide a reset signal to the light-sensing pixels; and
a plurality of phase inverters each connected between corresponding reset lines and gate lines, wherein
each of the display pixels includes a display cell and a first switch transistor for controlling turning ON or OFF of the display cell,
each of the light-sensing pixels includes a light sensor transistor configured to sense light, and a second switch transistor configured to output a light-sensing signal from the light sensor transistor, and
the first switch transistors, the second switch transistors, and the light sensor transistors are configured such that the first switch transistor receives a gate voltage, the second switch transistor receives the gate voltage and the light sensor transistors in a same row receive a reset signal at a same time, the gate voltage and the reset signal having phases that are inverted from one another.

17. The optical touch screen apparatus of claim 16, wherein input terminals of each of the phase inverters are connected to corresponding gate lines, and output terminal of each of the phase inverters are connected to corresponding reset lines.

18. The optical touch screen apparatus of claim 16, wherein the light sensor transistors comprise an oxide semiconductor transistor including an oxide semiconductor as a material of a channel layer.

19. The optical touch screen apparatus of claim 16, further comprising:
a gate driver configured to sequentially provide a gate voltage to the plurality of gate lines;
a signal output unit including a plurality of data lines arranged in a column direction and configured to receive a light-sensing signal from the light-sensing pixels and output a data signal; and
a data driver including a plurality of image data lines arranged in a column direction and configured to provide an image signal to the display pixels.

20. The optical touch screen apparatus of claim 19, wherein the gate lines are directly connected to the gate driver, and the reset lines are indirectly connected to the gate driver via the phase inverters and the gate lines.

21. The optical touch screen apparatus of claim 16, wherein each of the gate lines is connected to the display pixels and the light-sensing pixels in the same row, wherein each of the gate lines is connected to gates of the first switch transistors in the same row and gates of the second switch transistors of the light-sensing pixels in that same row.

22. The optical touch screen apparatus of claim 21, wherein each of the reset lines is connected to the light-sensing pixels in the same row, wherein each of the reset lines is connected to gates of the light sensor transistors of the light-sensing pixels in the same row.

23. The optical touch screen apparatus of claim 16, wherein the second switch transistors and the light-sensor transistors in the same row are connected in series.

24. A method of operating a light-sensing apparatus including a plurality of light-sensing pixels arranged in rows and columns, each light-sensing pixel including a light sensor transistor configured to sense light, a switch transistor configured to output a light-sensing signal from the light sensor transistor, a gate line connected to gate of the switch transistor, a reset line connected to a gate of the light sensor transistor, and a phase inverter connected between the reset line and the gate line, the method comprising:
applying a positive first gate voltage to gates of the switch transistors of the light-sensing pixels in one of the rows via the gate line, and at a same time applying a negative second gate voltage to gates of the light sensor transistors of the light-sensing pixels in a same row via the reset line, the positive first gate voltage being greater than or equal to a threshold voltage, and the negative second gate voltage being obtained by inverting the positive gate voltage using the phase inverter.

25. The method of claim 24, further comprising:
applying a negative second gate voltage to gates of the switch transistors of the light-sensing pixels in the rest of the rows and at the same time applying a positive first gate voltage to gates of the light sensor transistors of the light-sensing pixels in the rest of the rows, the negative second gate voltage being less than the threshold voltage, and the positive first gate voltage having an inverted phase with respect to the negative second gate voltage.

* * * * *